(12) United States Patent
Takano et al.

(10) Patent No.: US 6,891,732 B2
(45) Date of Patent: May 10, 2005

(54) MULTILAYER CIRCUIT BOARD AND SEMICONDUCTOR DEVICE USING THE SAME

(75) Inventors: Akihito Takano, Nagano (JP); Takahiro Iijima, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 127 days.

(21) Appl. No.: 10/244,210

(22) Filed: Sep. 16, 2002

(65) Prior Publication Data

US 2003/0058630 A1 Mar. 27, 2003

(30) Foreign Application Priority Data

Sep. 25, 2001 (JP) ........................................ 2001-291329

(51) Int. Cl.[7] .............................. H05K 7/02; H05K 7/06; H05K 7/08; H05K 7/10
(52) U.S. Cl. ........................ 361/783; 361/793; 257/707
(58) Field of Search ................................. 361/792–795, 361/760–764, 783; 257/700–704; 438/121–123; 174/252, 258–262

(56) References Cited

U.S. PATENT DOCUMENTS

| | | | | |
|---|---|---|---|---|
| 4,963,697 A | * | 10/1990 | Peterson et al. | 174/252 |
| 5,239,448 A | * | 8/1993 | Perkins et al. | 361/764 |
| 5,616,888 A | * | 4/1997 | McLaughlin et al. | 174/260 |
| 5,644,327 A | * | 7/1997 | Onyskevych et al. | 345/80 |
| 6,323,439 B1 | * | 11/2001 | Kambe et al. | 174/262 |

* cited by examiner

*Primary Examiner*—Kamand Cuneo
*Assistant Examiner*—Tuan Dinh
(74) *Attorney, Agent, or Firm*—Paul & Paul

(57) ABSTRACT

A multilayer circuit board for mounting a semiconductor element thereon, comprising a core substrate of a metal material and a plurality of wiring layers stacked on either side of the core substrate, each of the stacked wiring layers being isolated from an adjacent wiring layer by an insulating layer interposed therebetween, the multilayer circuit board having an area at which a heat spreader for dissipating heat generated from the semiconductor element mounted on the circuit board is to be joined to the multilayer circuit board, wherein the multilayer circuit board allows the heat spreader to be joined to the core substrate without the insulating layers being interposed therebetween. A semiconductor device using the multilayer circuit board is also disclosed.

18 Claims, 4 Drawing Sheets

MULTILAYER CIRCUIT BOARD AND SEMICONDUCTOR DEVICE USING THE SAME

BACKGROUND OF THE INVENTION

1. Field of the Invention

The invention relates to a multilayer circuit board or a multilayer wiring board and a semiconductor device and, more particularly, to a multilayer circuit board having improved heat-dissipating properties and a semiconductor device using it.

2. Description of the Related Art

Among multilayer circuit boards used for semiconductor devices, there are products in which a metal substrate is used as a core substrate, and wiring layers are stacked on either side of the core substrate, each of the stacked wiring layers being isolated from an adjacent wiring layer by an insulating layer interposed therebetween. The stacked wiring layers can be formed on either side of the core substrate by a build-up process. According to a build-up process, a multilayer circuit board, in which one wiring layer is electrically connected to another wiring layer by vias through the insulating layer, can be obtained by forming an insulating layer electrically insulating wiring layers from each other and having via holes for the interconnection of the wiring layers, forming a conductor layer on the surface of the insulating layer and the inside of the via holes by plating or the like, and then etching the conductor layer in a given pattern.

A semiconductor device is produced by mounting, on the multilayer circuit board thus formed, a semiconductor chip or chips and required circuit parts. In recent years, semiconductor elements have had increasingly improved performances, thereby increasing the amount of heat generated therefrom. Conventional methods for dealing with an increased amount of heat generated from such a semiconductor element include a method of dissipating the generated heat by attaching a heat spreader (or heat sink) to the semiconductor element and using a fan. Also, a metal sheet with good heat-dissipating properties is used as a core substrate in order to improve the heat-dissipating properties of a multilayer circuit board on which a semiconductor element is mounted.

However, even with a multilayer circuit board using a metal sheet for a core substrate, the heat-dissipating properties are not always enough considering the increasing amount of heat generated from a semiconductor element, and a multilayer circuit board having better heat-dissipating properties is required to remove the heat generated from a semiconductor element.

It is known to use a member made of a metal to cover a semiconductor element mounted on a multilayer circuit board, to thereby dissipate heat generated by the semiconductor element from the top face of the metallic member to environment. Again, with a multilayer circuit board using such a cover member, heat-dissipating properties are not always enough to increase amount of heat removed from a semiconductor element, and a multilayer circuit board having improved heat-dissipating properties is again required.

SUMMARY OF THE INVENTION

It is an object of the invention to solve these problems, and to provide a multilayer circuit board, or a multilayer wiring board, which can have further improved heat-dissipating properties and makes it possible to mount thereon a semiconductor element potentially generating a large amount of heat.

It is also an object of the invention to provide a semiconductor device using the multilayer circuit board.

According to the invention, there is provided a multilayer circuit board or a multilayer wiring board, for mounting a semiconductor element thereon, comprising a core substrate of a metal material and a plurality of wiring layers stacked on either side of the core substrate, each of the stacked wiring layers being isolated from an adjacent wiring layer by an insulating layer interposed therebetween, the multilayer circuit board having an area at which a heat spreader for dissipating heat generated from the semiconductor element mounted on the circuit board is to be joined to the multilayer circuit board, wherein the multilayer circuit board is adapted to allow the heat spreader to be joined to the core substrate without the insulating layers being interposed therebetween.

In one embodiment, the multilayer circuit board can have thermal vias piercing through the insulating layers to thereby allow the heat spreader to be joined to the core substrate through the thermal vias, the thermal vias being formed of a material having a thermal conductivity greater than the thermal conductivity of the insulation layers.

Preferably, the thermal vias are formed of the same material as the material for the wiring layers.

The multilayer circuit board can be provided with a sealing conductor in the shape of a frame surrounding the area where the semiconductor element is to be mounted. The sealing conductor represents a member through which the heat spreader is connected to the thermal vias so as to ensure the thermal connection of the heat spreader to the thermal via.

Preferably, the sealing conductor is formed of the same material as the material for the thermal vias.

In another embodiment, the multilayer circuit board can have an area at which the core substrate is exposed to thereby allow the heat spreader to be directly joined to the core substrate.

In both the embodiments set out above, the multilayer circuit board can have thermal vias piercing through the insulating layers to thereby allow the semiconductor element to be thermally connected to the core substrate, the thermal vias being formed of a material having a thermal conductivity greater than the thermal conductivity of the insulation layers.

Preferably, the thermal vias thermally connecting the semiconductor element to the core substrate are also formed of the same material as the material for the wiring layers.

According to the invention, there is also provided a semiconductor device comprising a multilayer circuit board, a semiconductor element mounted on the multilayer circuit board, and a heat spreader for dissipating heat generated from the semiconductor element, the heat spreader being disposed so as to cover the semiconductor element, wherein the multilayer circuit board or multilayer wiring board for mounting a semiconductor element thereon is as set out above.

BRIEF DESCRIPTION OF THE DRAWINGS

The above and other objects and advantages of the invention will be well understood and appreciated, by a person with ordinary skill in the art, from the following detailed description made by referring to the attached drawings, wherein.

DETAILED DESCRIPTION OF THE INVENTION

Figure 1:
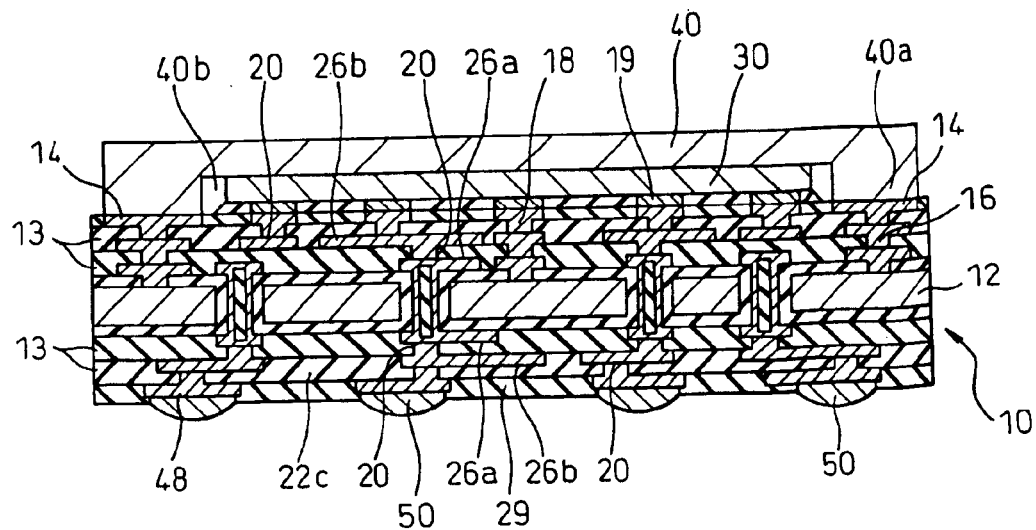
FIG. 1 shows a first embodiment of the semiconductor device of the invention.

FIG. 1 shows a sectional view illustrating the structure of a first embodiment of the semiconductor device according to the invention, fabricated by mounting a semiconductor element 30 on the multilayer circuit board 10 of the invention. The multilayer circuit board 10 used in this semiconductor device is formed by stacking a plurality of wiring layers 26a, 26b on either side of a core substrate 12 made of a metal, such as copper or aluminum, each of the stacked wiring layers 26a, 26b being isolated from an adjacent wiring layer by an insulating layer 13 interposed therebetween. The semiconductor element 30 is mounted on one side (the upper side in the drawing) of the multilayer circuit board 10 by flip chip bonding, and has a heat spreader 40 attached so as to cover the semiconductor element 30. The heat spreader is preferably made of a metal, such as copper or aluminum. Wiring patterns 26a, 26b of adjacent wiring layers are connected to each other by a via 20. The multilayer circuit board 10 is provided, on the side opposed to the side on which the semiconductor element 30 is mounted, with external connection terminals 50 to connect the multilayer circuit board 10 to external circuits (not shown).

On the side of the heat spreader 40 facing the multilayer circuit board 10, a concavity 40b for containing the semiconductor element 30 is formed. The heat spreader 40 is joined to the top side of the multilayer circuit board 10, containing the semiconductor element 30 within the concavity 40b. In the embodiment shown in FIG. 1, a sealing conductor 14, in the shape of frame surrounding the area where the semiconductor element 30 is mounted, is also provided on the surface of the multilayer circuit board 10. The sealing conductor 14 serves as a member through which the heat spreader is connected to the thermal vias 16 so as to ensure the thermal connection of the heat spreader 40 to the thermal vias 16. The heat spreader 40, which has a joining section 40a at its periphery, is attached to the multilayer circuit board 10, with the joining section 40a being joined to the sealing conductor 14. When the heat spreader 40 is joined to the multilayer circuit board 10, the outer side of the semiconductor element 30 is in contact with the inner bottom face of the concavity 40b of the heat spreader 40, and heat is efficiently dissipated from the semiconductor element 30 to the heat spreader 40. The heat spreader 40 is bonded to the sealing conductor 14 by solder or an adhesive.

In the invention, the core substrate may be grounded using an external connecting terminal, to thereby allow the heat spreader to have earth potential.

A characteristic feature of the multilayer circuit board 10 of the present embodiment is first thermal vias 16 and second thermal vias 18 are provided so as to pierce through the insulation layers 13 of the side of the circuit board 10 on which the semiconductor element 30 is mounted. The first and second thermal vias 16 and 18 are formed of a material (a conductor material) having a thermal conductivity greater than that of the material for the insulating layers, and the first thermal via 16 serves to connect the sealing conductor 14 to the core substrate 12 by the conductor to thereby enhance the thermal conductivity between the core substrate 12 and the heat spreader 40, and the second thermal via 18 serves to connect the semiconductor element 30 to the core substrate 12 by the conductor to thereby enhance the thermal conductivity between the core substrate 12 and the semiconductor element 30.

The first thermal vias 16, which connect the sealing conductor 14 to the core substrate 12, may be positioned, at a discretionary interval, in the direction of the circumference of the sealing conductor 14 provided in the shape of frame. The second thermal vias 18, which connect the semiconductor element 30 to the core substrate 12, are positioned in correspondence with the locations of thermal bumps 19 of the semiconductor element 30.

As shown in FIG. 1, the first and second thermal vias 16 and 18 are formed by filling the via holes of respective insulating layers with a conductor to form so-called filled vias, and successively coupling the filled vias of adjacent insulating layers so as to form a column-like structure. The first and second thermal vias 16 and 18 of such a column-like structure connect the sealing conductor 14 of the heat spreader 40 to the core substrate 12 and the semiconductor element 30 to the core substrate 10, respectively, to thereby enhance the thermal conductivity between the heat spreader 40 and the core substrate 12 and the thermal conductivity between the semiconductor element 30 and the core substrate 12, respectively.

Specifically, heat generated from the semiconductor element 30 is transferred from the surface of the semiconductor element 30 to the heat spreader 40 and transferred to the core substrate 12 through the second thermal vias 18, to thereby be dissipated, and the heat transferred to the core substrate 12 is, in turn, transferred to the heat spreader 40 through the first thermal vias 16 to be dissipated.

In the embodiment shown in FIG. 1, although both first thermal vias 16 connecting the heat spreader 40 to the core substrate 12 and second thermal vias 18 connecting the semiconductor element 30 to the core substrate 12 are provided, the second thermal vias 18 need not be always provided, and may be provided as required or depending on the arrangement of bumps of the semiconductor element 30.

Figure 2:
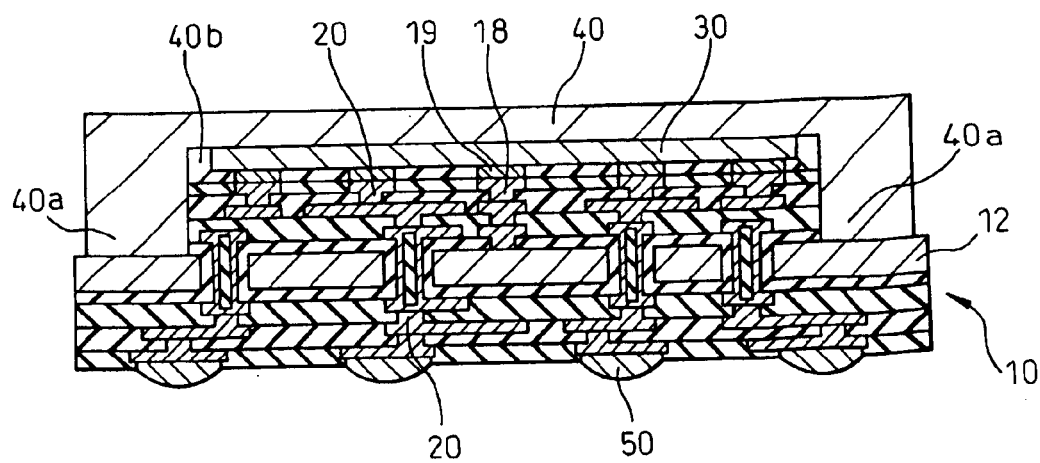
FIG. 2 shows a second embodiment of the semiconductor device of the invention.

FIG. 2 illustrates the structure of a second embodiment of the semiconductor device fabricated by mounting a semiconductor element 30 on the multilayer circuit board 10 of the invention. In the semiconductor device of this embodiment, the semiconductor element 30 is mounted on one side of the multilayer circuit board 10, and a heat spreader 40 is attached so as to cover the semiconductor element 30, as in the semiconductor device of the first embodiment. A characteristic feature of the semiconductor device of the present embodiment resides in the fact that a joining section 40a at the periphery of the heat spreader 40 is directly joined to the core substrate 12.

To directly join the heat spreader 40 to the core substrate 12, parts of respective insulating layers of the multilayer circuit board 10 are removed at the sites thereof corresponding to the joining section 40a of the heat spreader 40, to expose part of the surface of the core substrate 12 to which the joining section 40a of the heat spreader 40 is to be joined. The insulating layers 13 having parts thereof removed are contained, together with the wiring layers 26a, 26b of the circuit board 10 as well as the semiconductor element 40, within a concavity 40b of the heat spreader 40, the concavity 40b being surrounded by the joining section 40a of the heat spreader 40. At the condition of the heat spreader 40 being joined to the multilayer circuit board 10, the outer side of the semiconductor element 30 is in contact with the inner bottom face of the concavity 40b of the heat spreader 40.

Also in this embodiment, the multilayer circuit board 10 is provided with thermal vias 18, which connect thermal bumps 19 of the semiconductor element 30 to the core substrate 12. However, the thermal vias 18 need not be always provided, as indicated in the description of the first embodiment of the multilayer circuit board.

In the semiconductor device of this embodiment, heat generated from the semiconductor element 30 can be dissipated from the surface of the semiconductor element 30 to the heat spreader 40, while being dissipated to the core substrate 12 through the thermal vias 18. The direct contact of the core substrate 12 and the heat spreader 40 can further enhance the heat dissipation from the core substrate 12, whereby it is possible to effectively improve the heat dissipation of the entire semiconductor device.

The multilayer circuit board of the invention may be produced using a build-up process. By way of example, the multilayer circuit board 10 having the two types of thermal vias, i.e., the first and second thermal vias 16 and 18, as shown in FIG. 1, can be produced by forming wiring patterns on either side of the core substrate 12 by a build-up process. A method for producing the multilayer circuit board 10 of this type is illustrated in FIGS. 3A to H.

Figure 3A:
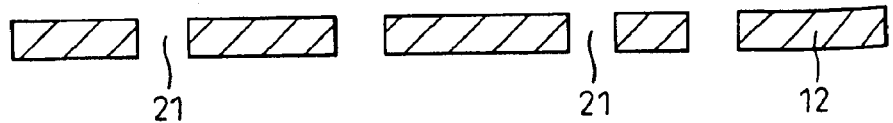
FIGS. 3A to 3H illustrates the production of the multilayer circuit board of the invention.

First, a core substrate 12 of metal sheet is drilled to have through holes 21, as shown in FIG. 3A. The through holes 21 are located at the sites of the core substrate 12 where wiring patterns formed on both sides of the core substrate 12 are to be electrically connected.

Figure 3B:
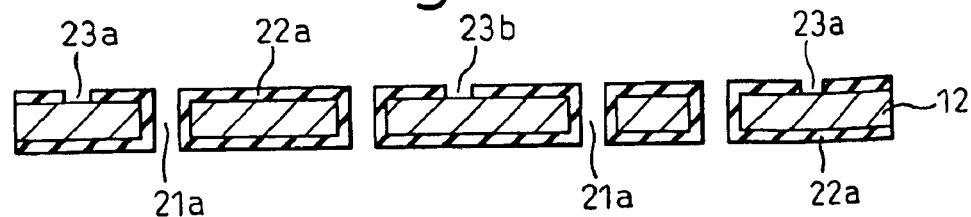

Subsequently, the core substrate 12 is sandwiched between sheets of resin having electrical insulating properties, such as polyimide, and the resin sheets are then heated and pressed to coat both surfaces of the core substrate 12 with an electrically insulating layer of the resin material and to fill the through holes 21 with the resin material. The resin material filled in the through hole 21 is bored a piercing hole which pierces the material. FIG. 3B illustrates the core substrate 12 provided with the electrically insulating layers 22a and the piercing hole 21a thus formed.

The insulating layer 22a on one side of the core substrate 12 is then bored via holes 23a and 23b. The via holes 23a are provided along the periphery of the core substrate 12, and are used to form the first thermal vias 16 serving to connect the heat spreader 40 to the core substrate 12, as shown in FIG. 1. The via holes 23b are used to form the second thermal vias 18 serving to connect the semiconductor element 30 to the core substrate 12, also as shown in FIG. 1. The via holes 23a and 23b can be formed by chemical etching or laser etching.

Figure 3C:
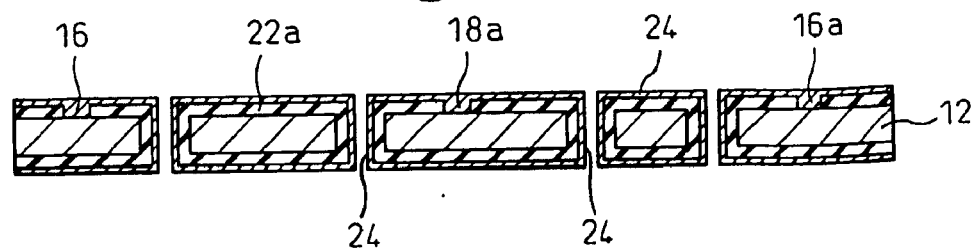

The substrate 12 is then subjected to electroless plating and electroplating with copper to form a conductor layer 24 on the insulating layer 22a and inside the piercing holes 21a, as shown in FIG. 3C. The conductor layer 24 inside the piercing hole 21a serves as a conductor for electrically connecting wiring patterns subsequently formed on both sides of the core substrate 12. By carrying out the electroless plating and electroplating under appropriate conditions, the via holes 23a and 23b can be filled with copper to form unitary thermal vias 16a and 18a for first and second thermal vias, respectively.

Figure 3D:
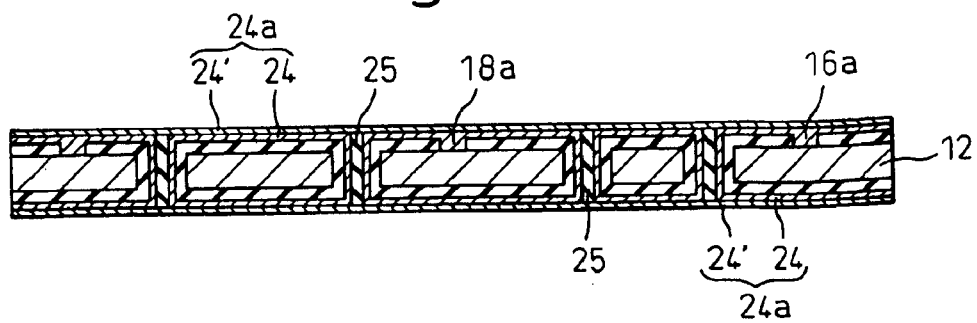

A resin material 25 is then filled in the piercing holes 21a coated with the conductor layer 24, and a further conductor layer 24' is formed by electroless plating and electroplating to cover the conductor layer 24 on both sides of the core substrate 12, to thereby provide, along with the conductor layer 24, a conductor film 24a, as shown in FIG. 3D.

Figure 3E:
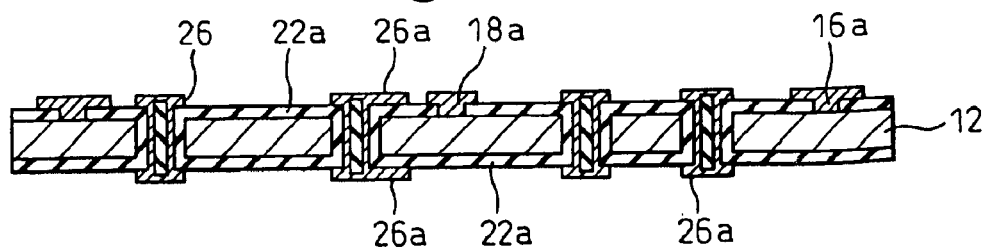

The conductor film 24a is chemically etched to form first wiring patterns 26a on the respective insulation layers 22a on either side of the core substrate 12, as shown in FIG. 3E. To form the wiring pattern 26a by etching the conductor film 24a, a photoresist may be coated on the surface of the conductor film 24a, and be exposed and developed to provide a resist pattern covering the sites of the conductor film 24a where the wiring pattern 26a is to be formed, and the conductor film 24a can then be etched using the resist pattern as a mask.

Figure 3F:
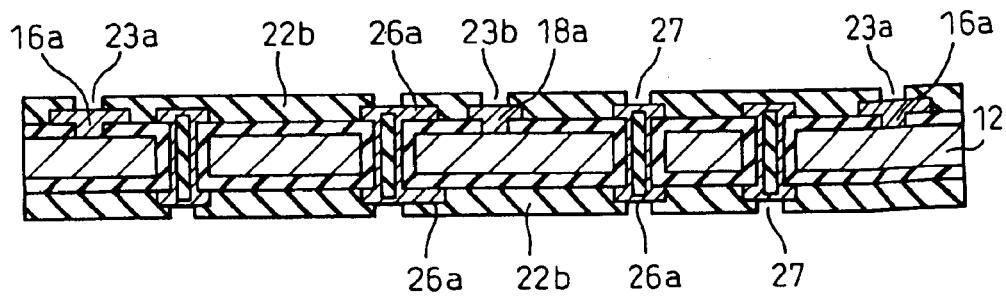

Subsequently, for the formation of second layers of wiring patters, sheets of electrically insulating resin, such as polyimide, are laminated on either side of the substrate 12 to provide second insulating layers 22b, the second insulating layers 22b being then laser-etched to form via holes 27 therein, as shown in FIG. 3F. Simultaneously, further via holes 23a and 23b are formed for the formation of the first and second thermal vias, the via holes 23a and 23b communicating with the unitary thermal vias 16a and 18a for first and second thermal vias of the underlying layer of wiring pattern.

Figure 3G:
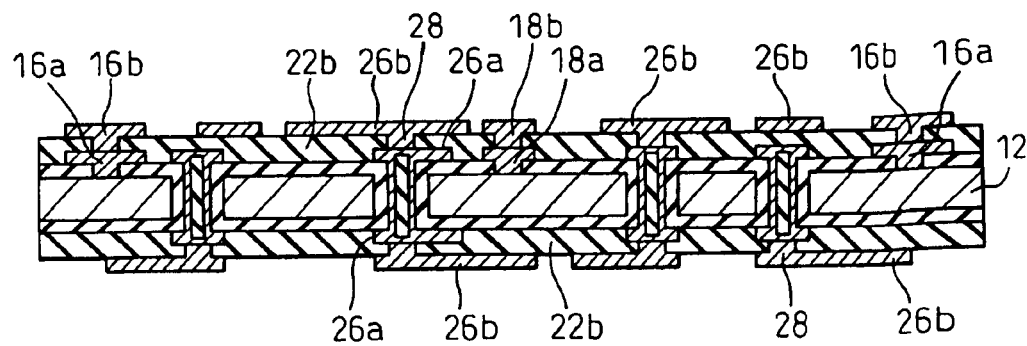

The surfaces of the substrate 12 having the insulating layers 22b formed are then electrolessly plated and electroplated with copper, to form thereon a conductor layer (copper layer) while filling the via holes 23a, 23b, 27 with copper, after which the conductor layers are etched to provide second wiring patterns 26b, while forming first and second thermal vias 16b and 18b positioned on and connected to the underlying unitary thermal vias 16a and 18a, respectively, as shown in FIG. 3G. The first wiring patterns 26a and the second wiring patterns 26b are connected with each other by vias 28, which are formed of the conductor filled in the via holes 27.

Figure 3H:
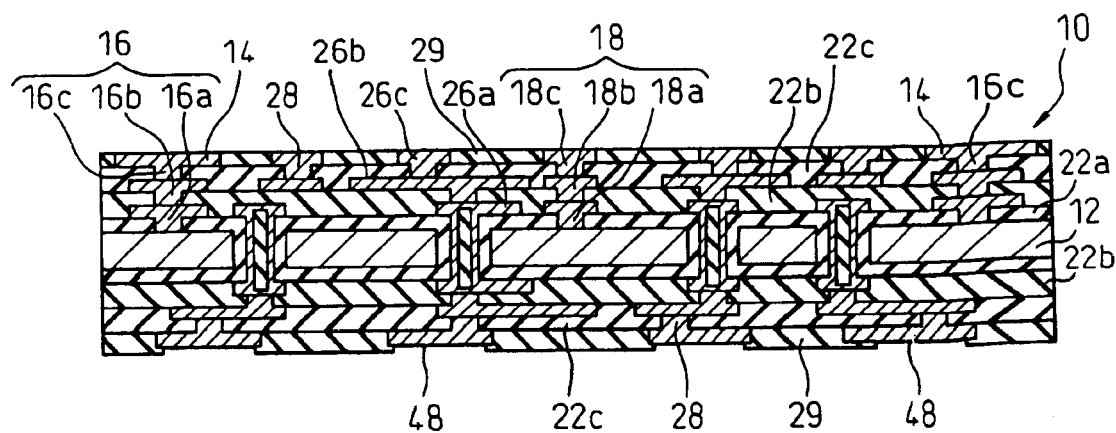

Sheets of insulating resin are then laminated on either side of the substrate 12 having the second wiring patterns 26b formed to provide third insulating layers 22c, the third insulating layers 22c being then laser-etched to form via holes therein, after which third wiring patterns 26c, vias 28 for the connection of the third wiring patterns 26c with the second wiring patterns 26b, first thermal vias 16c and second thermal vias 18c for the dissipation of heat generated from a semiconductor element, are formed, as described before, from a conductor, such as copper, as shown in FIG. 3H. Simultaneously, sealing conductor 14 in the shape of a frame surrounding the area where the semiconductor element 30 (FIG. 1) is to be mounted is formed from the conductor, and lands 48 for external connection terminals 50 (FIG. 1) are also formed, from the conductor, at the opposed side of the substrate 12. In a multilayer circuit board 10 thus produced, the entire first thermal via 16 for the connection of the core substrate 12 of the multilayer circuit board 10 with a heat spreader 40 (FIG. 1) is made up of the stacked unitary thermal vias 16a, 16b, 16c, and the entire second thermal via 18 for the connection of the core substrate 12 with a semiconductor element 30 (FIG. 1) to be mounted thereon is made up of the stacked unitary thermal vias 18a, 18b, 18c. As shown in FIG. 3H, the multilayer circuit board 10 is covered with a solder resist 29 so as to expose the patterned conductor on either side thereof.

Figure 4:
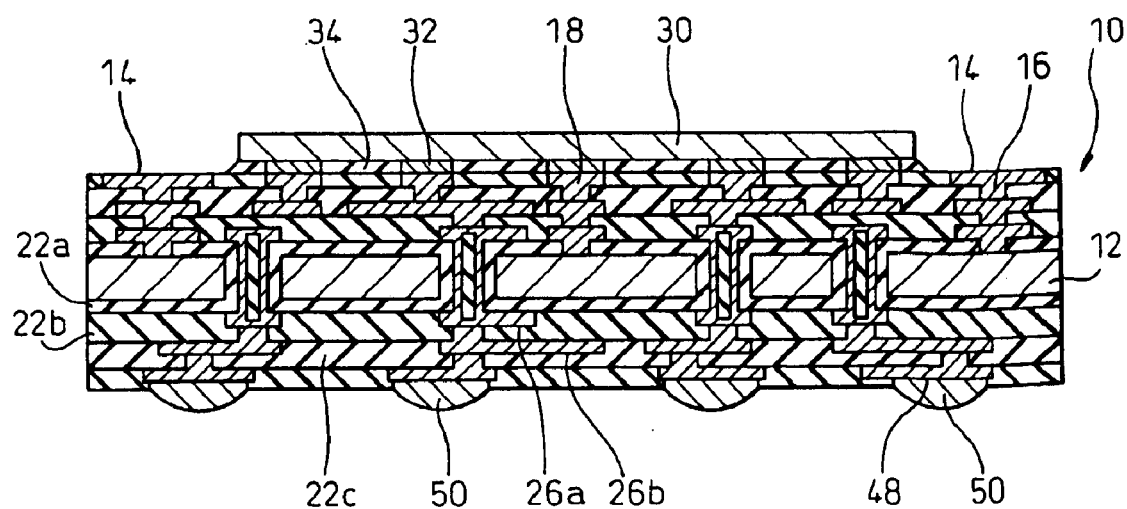
FIG. 4 illustrates the multilayer circuit board on which a semiconductor element is mounted.

FIG. 4 illustrates the multilayer circuit board 10 on which a semiconductor element 30 is mounted. The semiconductor element 30 is mounted on the multilayer circuit board 10 by flip-chip bonding, and is connected to the circuit board 10 through bumps 32. An underfill material 34 is filled in the gap between the circuit board 10 and the semiconductor element 30 after the flip-chip bonding. External connection terminals 50 are provided on the lands 48 on the side of the multilayer circuit board 10 opposed to the side on which the semiconductor element 30 is mounted. The external connection terminal may be formed by bonding a solder ball on the land 48.

The semiconductor device shown in FIG. 1 can be obtained by joining the joining section 40*a* of the heat spreader 40 (FIG. 1) to the multilayer circuit board 10 illustrated in FIG. 4.

When the semiconductor device, as shown in FIG. 2 and which has only the thermal vias 18 connecting the semiconductor element 30 to the core substrate 12, is produced, the multilayer circuit board having been fabricated as illustrated in FIGS. 3A to 3H can be subjected to machining, such as countersinking, to thereby remove the wiring layers and insulating layers from one side (the side on which the semiconductor element is to be mounted) of the circuit board at a peripheral portion thereof so as to exposed a corresponding portion of the core substrate to which the joining section 40*a* of the heat spreader 40 (FIG. 2) is to be connected. In this case, it is not necessary to form thermal vias for connecting the heat spreader to the core substrate at the peripheral area of the multilayer circuit board when the circuit board is produced.

In general, a plurality of multilayer circuit boards are formed together, in an arrangement of rows and columns, using a common core substrate, and individual multilayer circuit boards on the common core substrate are cut, along with the core substrate, into pieces of multilayer circuit board by milling, while being countersunk to have a peripheral area exposing the core substrate thereat. After the separation of the individual circuit boards, the semiconductor device as shown in FIG. 2 is obtained by joining the joining section 40*a* of the heat spreader 40 to the core substrate 12.

The multilayer circuit board of the invention makes it possible to improve thermal conductivity between the heat spreader and the core substrate by directly joining the heat spreader to the core substrate, to thereby improve the heat dissipating properties between the multilayer circuit board and the core substrate, which makes it possible, in turn, to mount on the multilayer circuit board a semiconductor element generating a large amount of heat. Thus, the invention makes it possible to provide a multilayer circuit board and a semiconductor element having high reliability. In addition, thermally connecting the semiconductor element to the core substrate can further enhance the heat dissipation from the semiconductor element.

What is claimed is:

1. A multilayer circuit board for mounting a semiconductor element thereon, comprising a core substrate of a metal material and a plurality of wiring layers stacked on either side of the core substrate, each of the stacked wiring layers being isolated from an adjacent wiring layer by an insulating layer interposed therebetween, the multilayer circuit board having an area at which a heat spreader for dissipating heat generated from the semiconductor element mounted on the circuit board is to be joined to the multilayer circuit board, wherein the multilayer circuit board is adapted to allow the heat spreader to be joined to the core substrate without the insulating layers being interposed therebetween, the multilayer circuit board having thermal vias piercing through the insulating layers to thereby allow the heat spreader to be joined to the core substrate through the thermal vias, the thermal vias being formed of a material having a thermal conductivity greater than the thermal conductivity of the insulating layers.

2. The multilayer circuit board of claim 1, wherein the thermal vias are formed of the same material as the material for the wiring layers.

3. The multilayer circuit board of claim 1, which is provided with a sealing conductor in the shape of a frame surrounding the area where the semiconductor element is to be mounted.

4. The multilayer circuit board of claim 1, which has second thermal vias piercing through the insulating layers to thereby allow the semiconductor element to be thermally connected to the core substrate, the thermal vias being formed of a material having a thermal conductivity greater than the thermal conductivity of the insulating layers.

5. The multilayer circuit board of claim 3, wherein the sealing conductor is formed of the same material as the material for the thermal vias.

6. The multilayer circuit board of claim 4, wherein the second thermal vias are formed of the same material as the material for the wiring layers.

7. A multilayer circuit board for mounting a semiconductor element thereon, comprising a core substrate of a metal material and a plurality of wiring layers stacked on either side of the core substrate, each of the stacked wiring layers being isolated from an adjacent wiring layer by an insulating layer interposed therebetween, the multilayer circuit board having an area at which a heat spreader for dissipating heat generated from the semiconductor element mounted on the circuit board is to be joined to the multilayer circuit board, wherein the multilayer circuit board is adapted to allow the heat spreader to be joined to the core substrate without the insulating layers being interposed therebetween, the multilayer circuit board having an area at which the core substrate is exposed to thereby allow the heat spreader to be directly joined to the core substrate, the exposed area of the substrate being located at the peripheral region of the substrate surrounding the semiconductor element mounted on the multilayer circuit board.

8. The multilayer circuit board of claim 7, which has thermal vias piercing through the insulating layers to thereby allow the semiconductor element to be thermally connected to the core substrate, the thermal vias being formed of a material having a thermal conductivity greater than the thermal conductivity of the insulating layers.

9. The multilayer circuit board of claim 8, wherein the thermal vias are formed of the same material as the material for the wiring layers.

10. A semiconductor device comprising a multilayer circuit board, a semiconductor element mounted on the multilayer circuit board, and a heat spreader for dissipating heat generated from the semiconductor element, the heat spreader being disposed so as to cover the semiconductor element, wherein the multilayer circuit board comprises a core substrate of a metal material and a plurality of wiring layers stacked on either side of the core substrate, each of the stacked wiring layers being isolated from an adjacent wiring layer by an insulating layer interposed therebetween, the multilayer circuit board having an area at which a heat spreader for dissipating heat generated from the semiconductor element mounted on the circuit board is to be joined to the multilayer circuit board, and wherein the multilayer circuit board allows the heat spreader to be joined to the core substrate without the insulating layers being interposed therebetween, the multilayer circuit board having thermal vias piercing through the insulating layers to thereby allow the heat spreader to be joined to the core substrate through the thermal vias, the thermal vias being formed of a material having a thermal conductivity greater than the thermal conductivity of the insulating layers.

11. The semiconductor device of claim 10, wherein the thermal vias are formed of the same material as the material for the wiring layers.

12. The semiconductor device of claim 10, wherein the multilayer circuit board is provided with a sealing conductor in the shape of a frame surrounding the area where the semiconductor element is mounted.

13. The semiconductor device of claim 10, wherein the multilayer circuit board has second thermal vias piercing through the insulating layers to thereby allow the semiconductor element to be thermally connected to the core substrate, the thermal vias being formed of a material having a thermal conductivity greater than the thermal conductivity of the insulating layers.

14. The semiconductor device of claim 12, wherein the sealing conductor is formed of the same material as the material for the thermal vias.

15. The semiconductor device of claim 13, wherein the second thermal vias are formed of the same material as the material for the wiring layers.

16. A semiconductor device comprising a multilayer circuit board, a semiconductor element mounted on the multilayer circuit board, and a heat spreader for dissipating heat generated from the semiconductor element, the heat spreader being disposed so as to cover the semiconductor element, wherein the multilayer circuit board comprises a core substrate of a metal material and a plurality of wiring layers stacked on either side of the core substrate, each of the stacked wiring layers being isolated from an adjacent wiring layer by an insulating layer interposed therebetween, the multilayer circuit board having an area at which a heat spreader for dissipating heat generated from the semiconductor element mounted on the circuit board is to be joined to the multilayer circuit board, and wherein the multilayer circuit board allows the heat spreader to be joined to the core substrate without the insulating layers being interposed therebetween, the multilayer circuit board having an area at which the core substrate is exposed to thereby allow the heat spreader to be directly jointed to the core substrate, the exposed area of the substrate being located at the peripheral region of the substrate surrounding the semiconductor element mounted on the multilayer circuit board.

17. The semiconductor device of claim 16, wherein the multilayer circuit board has thermal vias piercing through the insulating layers to thereby allow the semiconductor element to be thermally connected to the core substrate, the thermal vias being formed of a material having a thermal conductivity greater than the thermal conductivity of the insulating layers.

18. The semiconductor device of claim 17, wherein the thermal vias are formed of the same material as the material for the wiring layers.

* * * * *